United States Patent
Kitaguchi et al.

(10) Patent No.: US 6,399,226 B1
(45) Date of Patent: Jun. 4, 2002

(54) MATERIAL FOR ORGANIC ELECTROLUMINESCENCE DEVICE AND METHOD FOR PRODUCING THE SAME

(75) Inventors: Toru Kitaguchi, Yokohama; Hiroshi Fukumura, Sendai, both of (JP)

(73) Assignee: Daicel Chemical Industries, Ltd., Osaka (JP)

( * ) Notice: Subject to any disclaimer, the term of this patent is extended or adjusted under 35 U.S.C. 154(b) by 0 days.

(21) Appl. No.: 09/530,429

(22) PCT Filed: Aug. 27, 1999

(86) PCT No.: PCT/JP99/04668

§ 371 (c)(1),
(2), (4) Date: May 1, 2000

(87) PCT Pub. No.: WO00/13470

PCT Pub. Date: Mar. 9, 2000

(30) Foreign Application Priority Data

Sep. 1, 1998 (JP) ............................. 10-246924

(51) Int. Cl.$^7$ ......................... H05B 33/10; H05B 33/00
(52) U.S. Cl. ..................... 428/690; 257/102; 313/504
(58) Field of Search .................. 428/690, 917; 427/596; 257/102; 313/498, 504

(56) References Cited

U.S. PATENT DOCUMENTS 5,281,489 A * 1/1994 Mori et al. ................ 428/690

FOREIGN PATENT DOCUMENTS

| JP | A52138188 | 11/1976 |
| JP | A1313930 | 12/1989 |
| JP | A6297457 | 10/1994 |
| JP | A7235378 | 9/1995 |
| JP | A896959 | 4/1996 |
| JP | A8106006 | 4/1996 |
| JP | A963770 | 3/1997 |
| JP | A10208881 | 8/1998 |

OTHER PUBLICATIONS

JP 06–297457, English translation.*
Fukumura, New Laser Research, vol. 24, No. 7, pp. 773–779 (1996).
Hebner et al., American Institute of Physics, Vol. 72, No. 5, pp. 519–521.

* cited by examiner

*Primary Examiner*—Cynthia H. Kelly
*Assistant Examiner*—Dawn Garrett
(74) *Attorney, Agent, or Firm*—Birch, Stewart, Kolasch & Birch, LLP

(57) ABSTRACT

An organic electroluminescence device material having emission centers is formed by bringing a source (1) containing an emission center-forming compound absorptive of laser beams into contact with a target (2) having at least one function selected from an electron-transporting function and a hole-transporting function, and irradiating a laser beam at an intensity of or below the ablation threshold value of the source (1) from the source (1) side (or the target (2) side) thereby to implant the emission center-forming compound (3) of the source (1) into the target (2). Thus, it is possible to make a fine and minute pattern on the organic electroluminescence device material.

13 Claims, 2 Drawing Sheets

MATERIAL FOR ORGANIC ELECTROLUMINESCENCE DEVICE AND METHOD FOR PRODUCING THE SAME

This application is the national phase under 35 U.S.C. §371 of PCT International Application No. PCT/JP99/04668 which has an International filing date of Aug. 27, 1999, which designated the United States of America.

TECHNICAL FIELD

The present invention relates to a process for producing a material for organic electroluminescence device by implanting or injecting an emission center-forming compound through molecular implantation with laser, a material for organic electroluminesdence device obtained by this process, and to an organic electroluminescence device (elements) produced with this organic electroluminescence device material.

BACKGROUND TECHNOLOGY

Electroluminescence devices (hereinafter, sometimes referred to simply as EL devices) have generally been classified as inorganic EL devices or organic EL devices according to what they are made from. On one hand some inorganic EL devices utilizing inorganic fluorescent molecules are already in practical use, and have been brought into application to the backlight of clocks or the like, while on the other hand organic EL devices have been desired to be brought into practical use because of their excellence in brightness or luminance, efficiency, and high-speed responsivity.

Electroluminescence devices are made from a compound or compounds having an electron-transporting function, a hole-transporting function, and an emission center-forming function. As for their structures, there have been reported devices of the single-layer type having a single layer provided with all the functions mentioned above, and devices of the multilayer-type composed of layers having different functions. The principle of light emission is considered to be based on the phenomenon that electrons or holes injected from a pair of electrodes recombine within a light-emitting layer to form excitons, which excite the molecules of a light emissive material for the light-emitting layer.

As a compound constituting each layer, a low-molecular weight compound of high light-emission efficiency, a macromolecular compound having high physical strength, or the like is employed. However, when a low-molecular weight compound is used, a film is formed by means of a vapor deposition technique which is inferior in productivity, while a macromolecular compound is formed into a film by coating or applying a solution and thus capable of being formed into films of larger sizes.

Japanese Patent Application Laid-Open No. 96959/1996 (JP-A-8-96959) and Japanese Patent Application Laid-Open No. 63770/1997 (JP-A-9-63770) disclose organic EL devices comprising a single light-emitting layer made of a polymer binder within which varieties of fluorescent dyes (or colorants, pigments) are dispersed, the polymer binder having both electron-transporting function and hole-transporting function. Each of these organic EL devises is reported to present, as a whole, white light due to the light emission of each light-emitting compound independent of one another. Moreover, as compared with organic EL devices of the multilayer-type, those of the single-layer type are hardly deteriorated in light-emission intensity.

Fine patterning, particularly multicolor patterning (full-coloration) of these organic EL devices is difficult because, in their fabrication, a film is formed by means of a solution coating technique in which a solution of a polymer binder and a fluorescent dye(s) dispersed in a specific solvent is applied onto a substrate.

As multicolor patterning methods, a color filer method, a color-converting method, the ink-jet method by T. R. Hebner (Appl. Phys. Lett. 72,5 (1998), p.519), the photobleaching method by Kido, et al, and others have been reported.

The color filter method or color-converting method has the advantage of not requiring the patterning of a light-emitting layer, but suffers deterioration in conversion efficiency caused by the use of a filter. In the ink-jet method, a pattern formed by ink-jet printing shows a center-raised, i.e., conical profile and is inferior in smoothness of its surface, resulting in difficulty in uniformly providing electrodes thereon. Moreover, the cross section of the pattern is desired to be rectangular, but that of a pattern by ink-jet printing cannot be formed so and is circular. Further, the dimensions of a pattern largely depends on conditions under which the pattern is dried and the concentration of the solution. In the photobleaching method, only a special emission center-forming compound which loses its fluorescence upon UV oxidation is employable and therefore colors expressable by EL devices are limited.

As was described above, in conventional film-forming methods by solution coating, although it is possible to use a macromolecular compound of high physical strength, it is difficult to provide fine patterns. In addition to that, also in the above-described patterning methods, compounds available for these methods are limited, and films having surface smoothness suitable for organic EL devices cannot be obtained.

As the molecular implantation technique, Japanese Patent Application Laid-Open No. 297457/1994 (JP-A-6-297457) discloses a method comprising a step of, with (A) a functional material or a solid material containing a functional material and (B) a solid material into which a functional component is to be implanted placed such as to face each other, irradiating a laser pulse thereby to implant the functional component into the solid material. Japanese Patent Application Laid-Open No. 106006/1996 (JP-A-8-106006) discloses a method comprising the steps of bringing a source film of an organic macromolecular compound within which dyes absorptive of a pulse laser are dispersed into tight contact with a target film of an organic macromolecular compound transmittable of a pulse laser, and irradiating a pulse laser from the target film side at an intensity of or below the ablation threshold value of the source film thereby to implant the dyes into the target film. This literature says that the molecular implantation technique can be utilized in the fabrication of color filters for displays or the like.

Accordingly, an object of the present invention is to provide a material for organic EL device (particularly, organic EL device-use films) that can be fine-patterned even when a macromolecular compound is used as an EL device material, and a process for producing the same.

Another object of the present invention is to provide a material for organic EL device which is excellent in surface smoothness and has good contactness with electrodes, and an organic EL device using the same.

DISCLOSURE OF THE INVENTION

The inventors of the present invention made intensive and extensive studies to achieve the above objects, and finally found that a molecular implantation technique using a laser makes it possible to implant an emission center-forming compound(s) with ease even in the case of injection into a macromolecular compound, and provide organic EL devices that can be finely and minutely patterned.

That is, the production process of a material for organic EL device of the present invention comprises the steps of
bringing a source (A) containing an emission center-forming compound absorptive of a laser beam into contact with a target (B) which is transmittable of the laser beam and has at least one function selected from an electron-transporting function and a hole-transporting function, and
irradiating the laser beam from the source (A) side or the target (B) side at an intensity of or below the ablation threshold (value) of the source (A) thereby to implant the emission center-forming compound into the target (B), providing a material for organic electroluminescence device having luminescence (emission) centers. The target may be an organic polymer having at least one function selected from the electron-transporting function and the hole-transporting function (e.g., poly-N-vinylcarbazol) or may comprise a compound having at least one function selected from the electron-transporting function and the hole-transporting function and an organic polymer having film-forming properties or film-formability.

The organic EL device material may be in the form of a film, and the laser beam may be a pulse laser beam (pulsed laser) having a pulse width of 10 Ps to 10 μs. The laser beam diameter may be 1 μm to 5 mm.

The present invention includes a material for organic EL device obtained in accordance with the process described above, and an organic EL device (element) formed with this organic EL device material.

BEST MODE FOR CARRYING OUT THE INVENTION

Figure 1:
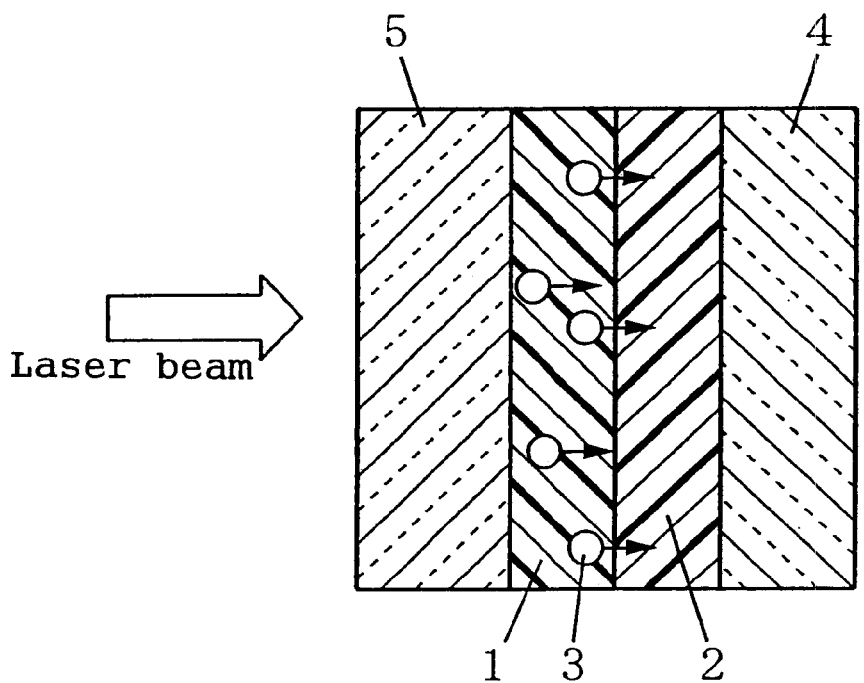
FIG. 1 is a schematic view showing a technique for implanting or injecting an emission center-forming compound.

The source (A) and the target (B) in the present invention can be used in any form and there is no particular restriction, but they are usually used in the form of films.
[Source (A)]

The source need only be capable of containing an emission center-forming compound, and its production process is not particularly restricted. The source comprises, for example, an emission center-forming compound and a variety of organic polymers (e.g., thermoplastic resins, thermosetting resins). As the organic polymer, usually, use can be made of resins having film-forming properties (or film-formability).

Thermoplastic resins include olefinic resins such as polyethylene, polypropylene, ethylene-propylene copolymer, and polybutene; styrenic resins such as polystyrene, rubber-modified polystyrene (HIPS), acrylonitrile-styrene copolymer, and acrylonitrile-butadiene-styrene copolymer; acrylic resins exemplified by homo- or copolymers of (meth)acrylic monomers, such as polymethyl methacrylate, copolymers of (meth)acrylates and copolymerizable monomers, such as methyl methacrylate-styrene copolymer, and polyacrylonitrile; vinyl-series resins exemplified by vinyl alcohol-series polymers, such as polyvinyl alcohol and ethylene-vinyl alcohol copolymer, polyvinyl chloride, vinyl chloride-vinyl acetate copolymer, polyvinylidene chloride, polyvinyl acetate, ethylene-vinyl acetate copolymer; polyamide-series resins such as 6-nylon, 6,6-nylon, 6,10-nylon, 6,12-nylon; polyester-series resins such as polyalkylene terephthalates (e.g., polyethylene terephthalate, polybutylene terephthalate), polyalkylene naphthalates; fluororesins; polycarbonates; polyacetals; polyphenylene ether; polyphenelene sulfide; polyethersulfone; polyether ketone; thermoplastic polyimide; thermoplastic polyurethane; and norbornene-series polymers.

Included among the thermosetting resins are phenolic resins, urea resins, meramine resins, thermosetting acrylic resins, unsaturated polyester resins, alkyd resins, diallyl phthalate resins, epoxy resins, and silicone resins.

These macromolecular compounds may be used either singly or in combination.
[Emission Center-forming Compound]

The luminescence (emission) center-forming compound need only be a compound having functions that qualify the compound as an emission center-forming compound for organic El devices and absorptive of laser beams, example of which are heterocyclic compounds containing at least one hetero atom selected from oxygen atom, nitrogen atom and sulfur atom, such as 2,5-bis (5-tert-butyl-2-benzoxazoyle)-thiophene, nile red, coumarins typified by coumarin 6 and coumarin 7,4-(dicyanomethylene)-2-methyl-6-(p-dimethylaminostyryl)-4H-pyran, and quinacridone; condensed polycyclic hydrocarbons such as rubrene and perylene; 1,1,4,4-tetraphenyl-1,3-butadiene (TPB), 1,4-bis (2-(4-ethylphenyl)ethynyl)benzene, and 4.4'-bis(2,2'-diphenylvinyl)biphenyl, with nile red and coumarin 6 particularly preferred.

The structures of nile red and coumarin 6 are shown below:

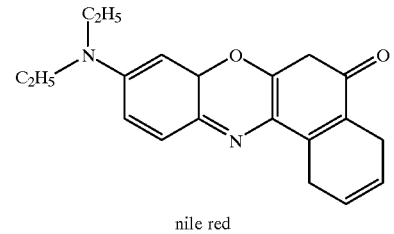

nile red

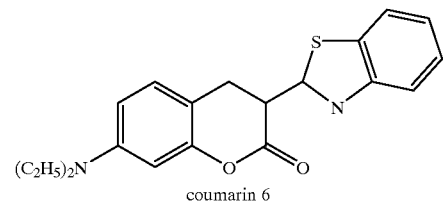

coumarin 6

The wavelength of light emitted by nile red is 580 nm (emission of red light) and that of coumarin 6 is 490 nm (emission of green light).

These emission center-forming compound may be used either singly or in combination.

The proportion of the emission center-forming compound contained in the source (A) is not particularly limited, and is, e.g., about 0.1 to 30 parts by weight, preferably about 1 to 25 parts by weight, and more preferably about 3 to 20 parts by weight relative to 100 parts by weight of the source.

[Target (B)]

Insofar as the target is transmittable of laser beams and has at least one function selected from the electron-transporting and the hole-transporting function, there is no particular restriction in respect of the material forming the target, and the target may be (I) a resin (organic polymer) having at least one function selected from the electron-transporting function and the hole-transporting function, or (II) a resin material which originally has neither the electron-transporting function nor the hole-transporting function but to which the electron-transporting function and the hole-transporting function may be given. As the resins (I) and (II), resins having film- or coat-forming properties are preferable (organic polymers).

As the resin (I) having at least one function selected from the electron-transporting function and the hole-transporting function, there may be exemplified polyphenylenevinylenes such as polyphenylenevinylene, poly-2,5-dimethoxyphenylenevinylene, and polynaphthalenevinylene; polyphenylenes (particularly, polyparaphenylene) such as polyparaphenylene and poly-2,5-dimethoxyparaphenylene; polyalkylthiophenes such as poly(3-alkylthiophene); polycycloalkylthiophenes such as poly(3-cyclohexylthiophene); polyarylthiophenes such as poly(3-(4-n-phexylphenyl)thiophene; polyfluorenes such as polyalkylfluorene; vinyl-series polymers having at least one functional group selected from hole-transporting functional groups and electron-transporting functional groups in the main chain or side chain, such as poly-N-vinylcarbazole (PVK), poly-4-N,N-diphenylaminostyrene, poly(N-(p-diphenylamino)phenylmethacrylamide), poly(N,N'-diphenyl-N,N'-bis(3-methylphenyl)-1,1'-biphenyl-4,4'-diaminomethacrylamide) (PTPDMA), and poly-4-(5-naphthyl-1,3,4-oxadiazole)styrene; polymethylphenylsilane; polymers having an aromatic amine derivative in the side or main chain; and copolymers thereof. These resins may be used either singly or in combination. Included among the preferred targets are poly-N-vinylcarbazole having a hole-transporting function, copolymers containing N-vinylcarbazole as a main constituent, and aromatic amine derivatives.

PVK is amorphous and excellent in heat resistance (glass transition temperature Tg: 224° C.). The degree of polymerization of PVK is not particularly restricted, and is, for example, about 200 to 200,000, preferably about 500 to 50,000.

Further, if needed, the electron-transporting function or hole-transporting function is given to the resin (I).

Examples of the compound having an electron-transporting function are oxadiazole derivatives such as 2-(4-biphenyl)-5-(4-tert-butylphenyl)-1,3,4-oxadiazole (PBD), 2,5-bis(1-naphthyl)-1,3,4-oxadiazole (BND), 1,3-bis[5-(4-tert-butylphenyl)-1,3,4-oxadiazole]benzene (BPOB), 1,3,5-tris[5-(4-tert-butylphenyl)-1,3,4-oxadiazole]benzene (TPOB), and 1,3,5-tris[5-(1-naphthyl)-1,3,4-oxadiazole]benzene (TNOB); diphenoquinones such as 3,5,3',5'-tetrakis-tert-butyldiphenoquinone; 1,2,3,4,5-pentaphenyl-1,3-cyclopentadiene (PPCP); and quinolinic acid complexes such as tris(8-quinolinorato)aluminium (III) complex, bis(benzoquinolinorato)beryllium complex, tris(10-hydroxybenzo[h]quinolilate)beryllium complex, with PBD particularly preferred.

As the compound having a hole-transporting function, there may be exemplified aromatic tertiary amines such as N,N'-diphenyl-N,N'-bis(3-methylphenyl)-1,1'-biphenyl-4,4'-diamine (TPD), N,N'-diphenyl-N,N'-bis(1-naphthyl)-1,1'-biphenyl-4,4'-diamine (NPD), 1,1-bis[(di-4-tolylamino)phenyl]cyclohexane, N,N,N'N'-tetra(3-methylphenyl)-1,3-diaminobenzene (PDA), 4,4',4"tris(3-methylphenylphenylamino)triphenylamine (m-MTDATA), 4,4',4"-tris(1-naphthylphenylamino)triphenylamine(1-TNATA), 4,4',4"-tris(2-naphthylphenylamino)triphenylamine (2-TNATA), 4,4',4"-tri(N-carbozolyl)triphenylamine (TCTA), 1,3,5-tris[4-(3-methylphenylphenylamino)phenyl]benzene (m-MTDAPB), and triphenylamine; and phthalocyanines.

These compounds can be used either singly or in combination. Incidentally, these can also be used as emission center-forming compounds.

The proportion of the above-mentioned component contained in the resin (I) (e.g., PVK) can be selected from within the range not adversely affecting the functions qualifying the resin as an organic EL device material, and is, for example, about 10 to 300 parts by weight and preferably about 20 to 200 parts by weight relative to 100 parts by weight of the target.

When the target contains such component or components, an organic EL device which will later be described can be made such as to have a single-layer structure, and the organic EL device so fabricated not only has improved luminous efficiency but also is economically advantageous.

There is no specific restriction in respect of the resin (II), and such a variety of organic polymers as exemplified in the section discussing the source (e.g., thermoplastic resins, thermosetting resins) are available. At least one function selected from the electron-transporting function and the hole-transporting function may be given to these resins. Exemplified as the compound(s) to be used are compounds similar to those enumerated above. Usually, use can be made of resins having film- or coat-forming properties.

The amount of the compound having an electron-transporting or hole-transporting function to be added is about 10 to 300 parts by weight and preferably about 20 to 200 parts by weight relative to 100 parts by weight of the resin (II).

The resin (I) and the resin (II) may be used in combination, and to a material of such combination may further be given at least one function selected from the electron-transporting function and the hole-transporting function.

[Production Process of Organic EL Device Material (Molecular Implantation)]

The process for producing organic EL device materials of the present invention comprises the steps of bringing a source (A) into contact with a target (B) and irradiating a laser beam through the source (A) or the target (B) at an intensity of or below the ablation threshold value of the source (A) thereby to implant or inject the emission center-forming compound into the target (B), providing an organic electroluminescence device material having luminescence centers. Films for organic EL device are usually produced using a source film and a target film.

Exemplified as the laser beam to be used in the present invention are, though it differs depending on the species of the emission center-forming compound to be used, laser beams having an oscillation wavelength within the range of 190 to 1,100 nm. When using a pulse laser beam (pulsed laser beam), the frequency is about 0.5 to 50 Hz and preferably about 0.5 to 30 Hz. Moreover, although the pulse width varies depending on the wavelength of the laser beam, it is 10 ps to 10 μs, preferably about 10 ps to 100 ns. The shorter the pulse width (duration) is, the less the decomposition of the emission center-forming compound occurs, and therefore, the emission center-forming compound is hardly damaged.

Exemplified as the source of the laser beam are ArF excimer laser (193 nm), KrF excimer laser (248 nm), XeCl excimer laser (308 nm), XeF excimer laser (351 nm), nitrogen laser (337 nm), dye laser (nitrogen laser, excimer laser, or YAG laser excitation, 300 to 1,000 nm), solid-state laser (Nd:YAG excitation, semiconductor laser excitation, etc.), ruby laser (694 nm), semiconductor laser (650 to 980 nm), tunable diode laser (630 to 1,550 nm), titanium-sapphire laser (Nd:YAG excitation, 345 to 500 nm, 690 to 1,000 nm), and Nd:YAG laser (FHG: 266 nm, THG: 354 nm, SHG: 532 nm, fundamental wave: 1,064 nm).

In the production process of the present invention, it is important to irradiate a laser beam at an intensity of or below the ablation threshold of the source film (A). Irradiation of a laser beam at an intensity of or below the ablation threshold makes it possible to effectively implant the emission center-forming compound contained in the source film (A). Particularly, the amount of the emission center-forming compound to be implanted can be controlled by regulating, e.g., the intensity and wavelength of the laser, and how many times the laser beam is shot.

The ablation threshold of the source film (A) varies depending on the species of the compound forming the film and that of the emission center-forming compound. Moreover, the ablation threshold also depends on the wavelength and pulse width of the laser beam. In the present invention, the ablation threshold is defined as follows.

The term "ablation threshold value" used in the present invention is defined as a term referring to, assuming that a source film is irradiated with one shot of laser beam and observed by a contact-type surface morphology measuring apparatus (e.g., DEKTAK3030ST, manufactured by SLOAN), the lowest laser intensity (mJ/cm$^2$) measured on the surface irradiated with the laser beam at which intensity the surface might suffer changes in surface conditions or morphology by a depth of 50 nm or more, the source and the laser being the same as those employed in the present invention.

Hereinafter, the process of the present invention for producing a material for organic EL device (particularly, films for organic EL device) will be described with reference to Figures. FIG. 1 shows one embodiment of the present invention. A source film (1), a target film (2), an emission center-forming compound (3), a substrate (4) for the target film side, and a substrate (5) for the source film side are illustrated therein.

Firstly, the target film (2) is interposed between the source film (1) and the substrate (4) such that the target film (2) is in contact with or intimate contact with the source film (1), and a laser beam is irradiated from the source film side at an intensity of or below the ablation threshold of the source film (1). Usually, the laser beam is shot about 1 to 50 times, preferably about 1 to 25 times. Having absorbed the laser beam, the emission center-forming compound in the source film obtains high translational energy and are injected or implanted from the source film into the target film without being decomposed, and there is provided a film for organic EL device.

The laser beam may be irradiated from the target film side.

The substrate that is used need only be transparent, and examples of which are plates of glass, such as soda glass, alkali-free glass and quartz glass, or polymer sheets or films of polyesters, polysulfonse, or polyethersulfones. In the case of fabrication of flexible organic EL devices, polymer films are preferred.

In the process of the present invention for producing a material for organic EL device, fine and minute patterning can be realized by suitably regulating the laser beam diameter according to the intended application. The beam diameter is not particularly limited, and is for example about 1 μm to 5 mm, preferably about 10 μm to 1 mm. Moreover, when irradiating the laser beam through a photomask, the photomask makes it possible to freely design not only the size but also the configuration of the pattern. Furthermore, at-a-time patterning over larger areas is made possible by using a photomask and increasing the diameter of the laser beam. Moreover, there may be used a plurality of sources having emission center-forming compounds different from one another. For example, the use of sources containing emission center-forming compounds of red, green, and blue makes the selection of color easier. Thus, according to the present invention, a material for organic EL device with a multicolor pattern of diversified configuration can be obtained.

According to the production process of the present invention, the emission center-forming compound can be injected into the target not in a dispersed or spread state but step-like (i.e., the emission center-forming compound is injected into the target by a uniform depth, showing a rectangular profile). The depth varies with the species of the emission center-forming compound or the target, or the laser intensity, and is for example about 10 nm to 300 nm, preferably about 15 nm to 200 nm, and more preferably about 20 nm to 100 nm. Furthermore, it is possible to implant only an emission center-forming compound without deteriorating the smoothness of the surface of an organic EL device material, for the irradiation is effected at an intensity of or below the ablation threshold.

[Organic Electroluminescence Device]

The organic electroluminescence device of the present invention comprises an organic EL device material obtained in accordance with the process described above (particularly, a light-emitting layer constituted of a target film into which an emission center-forming compound is injected) and a pair of electrodes.

As an anode, a transparent electrode formed by vacuum deposition or other methods (e.g., indium-tin-oxide (ITO) electrode) or the like is used, and a highly conductive metal having a small work function (e.g. ,magnesium, lithium, aluminium, or silver) is used as a cathode. In the case where magnesium is used as the cathode, the magnesium may be coevaporated (or co-deposited) with a small amount of silver (e.g., 1 to 10% by weight) for improving the adhesion with an organic EL device-use film.

When the light-emitting layer has both the electron-transporting function and the hole-transporting function, the organic EL device of the present invention can be made such as to have a single-layer structure. When the light-emitting layer is lacking in either the electron-transporting function or the hole-transporting function or when attempting to improve each function, a layer having the desired function may be laminated on the light-emitting layer by a conventional vapor deposition technique or a solution coating technique. These layers may be of low-molecular weight compounds or macromolecular compounds, and either will do. The organic EL device can take, for example, a single-layer structure or a multilayer-structure as shown in FIGS. 2 to 5.

Figure 2:
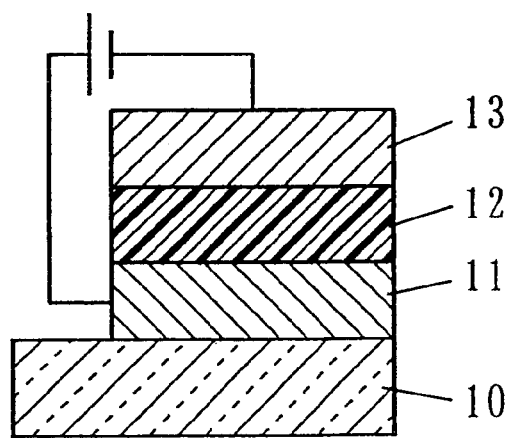
FIG. 2 is a schematic sectional view showing one embodiment (single-layer structure) of the organic electroluminescence device of the present invention.
Figure 3:
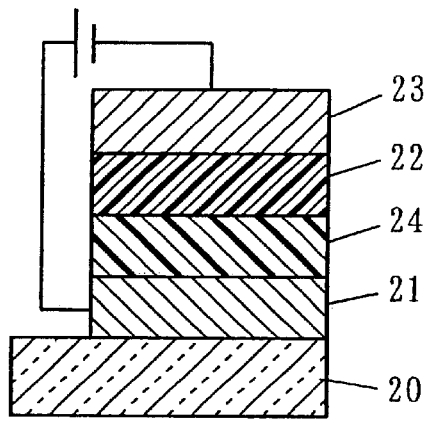
FIG. 3 is a schematic sectional view showing another embodiment (multilayer structure) of the organic electroluminescence device of the present invention.
Figure 4:
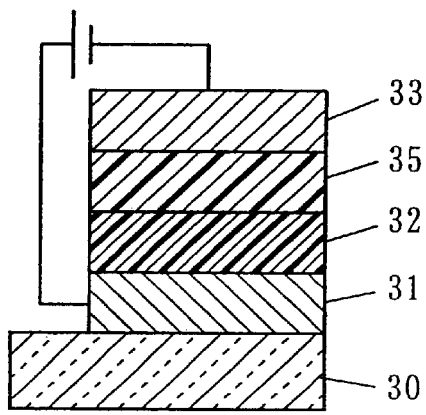
FIG. 4 is a schematic sectional view showing still another embodiment (multilayer structure) of the organic electroluminescence device of the present invention.
Figure 5:
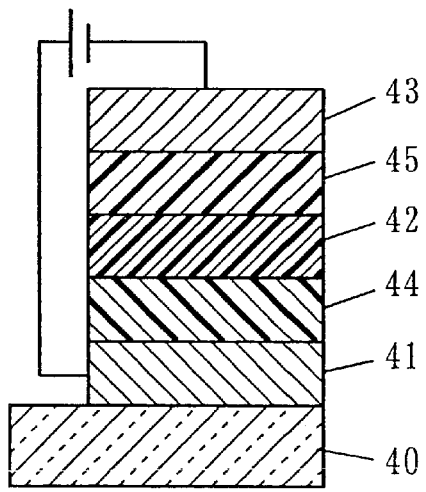
FIG. 5 is a schematic sectional view showing another embodiment (multilayer structure) of the organic electroluminescence device of the present invention.

That is, as illustrated in FIG. 2, the organic EL device may be one composed of a substrate (10), an anode (11) formed thereon, a light-emitting layer (12), and a cathode (13) laminated in this order, or, as shown in FIG. 3, it may be one composed of a substrate (20), an anode (21) formed thereon, a hole-transporting layer (24), light-emitting layer (22), and a cathode (23) laminated: in this order. Further, as shown in FIG. 4, the organic EL device may be one composed of a substrate (30), an anode (31) formed thereon, a light-emitting layer (32), an electron-transporting layer (35), and a cathode (33) laminated in this order, or, as shown in FIG. 5, it may be one composed of a substrate (40), an anode (41) formed thereon, a hole-transporting layer (44), a light-emitting layer (42), an electron-transporting layer (45), and a cathode (43) laminated in this order.

The thickness of each of the layers constituting the organic EL device is not particularly limited, and is about 100 to 10,000 Å (e.g., 100 to 5,000 Å), preferably about 300 to 3,000 Å, and more preferably about 300 to 2,000 Å. When films are used, the thickness of each film can be selected from within the ranges mentioned above.

According to the present invention, in fabricating organic EL devices, fine and multicolor patterning which had long been difficult to realize was made possible. Further, since the organic EL device material (particularly, organic EL device-use films) of the present invention is excellent in surface smoothness, it adheres to electrodes well, and the organic EL device of the present invention is free from the irregularity in voltage caused upon application of voltage because of the emission center-forming compound implanted step-like.

INDUSTRIAL APPLICABILITY

According to the present invention, since an emission center-forming compound is implanted within a target by means of a molecular implantation technique, fine and minute multicolor patterning is possible even when a macromolecular compound is used.

Moreover, irradiation at an intensity of or below the ablation threshold of a source makes it possible to uniformly implant the emission center-forming compound without deteriorating the smoothness of an organic EL device material. Thus, the use of the organic EL device material of the present invention realizes better adhesion with electrodes and uniform application of voltage.

EXAMPLES

Hereinafter, the present invention will be described in further detail but should by no means be construed as defining the scope of the invention.

Example 1
(Preparation of Source Film)

A source film of 2 $\mu$m thick was prepared by dissolving polybutyl methacrylate (Aldrich Chemical Company, Inc., molecular weight: $3.4 \times 10^5$ containing 5% by weight of coumarin 6 (Nippon Kankoh Shikiso, K.K.) in chlorobenzene and then applying the resultant mixture onto a substrate of quartz by spin coating.
(Preparation of Target Film) On the one hand 500 mg of poly-N-vinylcarbazol having a hole-transporting function (PVK: manufactured by Kanto Kagaku, K.K.) and 500 mg of 2-(4-biphenyl)-5-(4-tert-butylphenyl)- 1,3,4-oxadiazole having an electron-transporting function (PBD: Aldrich Chemical Company, Inc.) were dissolved in 10 ml of 1,2-dichloroethane while on the other hand a coat layer of indium-tin-oxide (ITO) was formed on a glass substrate. The ITO substrate thus obtained was subjected to a dip coating using the 1,2-dichloroethane solution to form, on the ITO coat layer, a target film having the electron hole-transporting functions of 1,000 Å thick.
(Molecular Implantation)

A test piece, composed of the two films obtained above being in contact with each other, was fabricated, and the test piece was irradiated with third harmonic of YAG laser (wavelength: 355 nm, pulse width: 3ns, irradiation energy per unit area: 20 mJ/cm$^2$, diameter: 1.8 mm) ten times (ten shots) at a frequency of 1 Hz from the direction of the substrate adjoining the target film.
(Organic EL device)

An Al/Li electrode of 2,000 Å thick (manufactured by Kohjundo Kagaku, K.K.; Li content: 0.5% by weight) was formed on the molecular-implanted target film by vacuum deposition, providing an organic EL device.

With the ITO electrode of the organic EL device as an anode and the Al/Li electrode layer as a cathode, a direct electric field was applied between the electrodes in the atmospheric air to cause the organic EL device to emit light. At a voltage of 18 V or so, emission of light was began to be observed. There was observed the emission of blue light of PVK from areas not implanted with molecules and of green light of coumarin 6 from areas implanted with molecules.

Example 2
(Preparation of Source Film)

A source film was obtained in the manner same as that in Example 1.
(Preparation of Target Film)

On one hand 150 mg of N,N'-diphenyl-N,N'-bis(3-methylphenyl)-1,1'-biphenyl-4,4'-diamine having a hole-transporting function (TPD: Tokyo Kasei K.K.), 300 mg of 2-(4-biphenyl)-5-(4-tertbutylphenyl)-1,3,4-oxadiazole having an electron-transporting function (PBD: Aldrich Chemical Company, Inc.), and 450 mg of polymethyl methacrylate as a binder polymer having no carrier-transporting function (Aldrich Chemical Company, Inc.; PMMA) were dissolved in 30 mL of 1,2-dichloroethane, while on the other hand a coat of indium-tin-oxide (ITO) was formed on a glass substrate. The ITO substrate thus obtained was subjected to a dip coating using the 1,2-dichloroethane solution to form, on the ITO coat, a target film having the electron hole-transporting functions of 1,000 Å thick.
(Molecular Implantation)

A test piece, composed of the two films obtained above being in contact with each other, was fabricated, and the test piece was irradiated with third harmonic of YAG laser (wavelength: 355 m, pulse width: 3 ns, irradiation energy per unit area: 20 mJ/cm$^2$, diameter: 1.8 mm) ten times (ten shots) at a frequency of 1 Hz from the direction of the substrate adjoining the target film.
(Organic EL device)

An Al/Li electrode of 2,000 Å thick (manufactured by Kohjundo Kagaku, K.K.; Li content: 0.5% by weight) was formed on the molecular-implanted target film by vacuum deposition, providing an organic EL device.

With the ITO electrode of the organic EL device as an anode and the Al/Li electrode layer as a cathode, a direct electric field was applied between the electrodes in the atmospheric air to cause the organic EL device to emit light. At a voltage of 15 V or so, emission of light was began to be observed. There was observed the emission of blue light of TPD from areas not implanted with molecules and of green light of coumarin 6 from areas not implanted with molecules.

Example 3

(Preparation of Source Film)

A source film was formed in the same manner as in Example 1.

(Preparation of Target Film)

A target film was formed in the same manner as in Example 2.

(Molecular Implantation)

A test piece, composed of the two films obtained above being in contact with each other, was fabricated, and the test piece was irradiated with third harmonic of YAG laser (wavelength: 355 nm, pulse width: 3 ns, irradiation energy per unit area: 20 mJ/cm$^2$, diameter: 1.8 mm) 20 times (20 shots) at a frequency of 1 Hz from the direction of the substrate adjoining the target film.

(Organic EL device)

An Al/Li electrode of 2,000 Å thick (manufactured by Kohjundo Kagaku, K.K.; Li content: 0.5% by weight) was formed on the molecular-implanted target film by vacuum deposition, providing an organic EL device.

With the ITO electrode of the organic EL device as an anode and the Al/Li electrode layer as a cathode, a direct electric field was applied between the electrodes in the atmospheric air to cause the organic EL device to emit light. At a voltage of 15 V or so, emission of light was began to be observed. There was observed the emission of blue light of TPD from areas not implanted with molecules and of green light of coumarin 6 from areas implanted with molecules.

What is claimed is:

1. A process for producing an organic electroluminescence device material having emission centers, which comprises:

bringing a source (A) containing an emission center-forming compound absorptive of a laser beam into contact with a target (B) having two sides, one of which is referred to as a source (A) side and one of which is referred to as a target (B) side, which target (B) is transmittable of a laser beam and has at least one function selected from an electron-transporting function and a hole-transporting function, and irradiating a laser beam at an intensity of or below the ablation threshold value of the source (A) from the source (A) side or from the target (B) side into said target (B), thereby to implant the emission center-forming compound of the source (A) into the target (B) for the formation of a pattern and to form emission centers in the target (B).

2. A process according to claim 1, wherein the organic electroluminescence device material is a film.

3. A process according to claim 1, wherein the laser beam is a pulse laser beam.

4. A process according to claim 3, wherein the pulse width of the pulse laser beam is 10 ps to 10 μs.

5. A process according to claim 1, wherein the diameter of the laser beam is 1 μm to 5 mm.

6. A process according to claim 1, wherein the target is an organic polymer having at least one function selected from the electron-transporting function and the hole-transporting function.

7. A process according to claim 6, wherein the organic polymer is a poly-N-vinylcarbazol or a copolymer comprising N-vinylcarbazol as a main component.

8. A process according to claim 1, wherein the target comprises a compound having at least one function selected from the electron-transporting function and the hole-transporting function, and an organic polymer having film-forming properties.

9. A process according to claim 8, wherein the compound is at least one compound selected from the group consisting of oxadiazole derivatives having the electron-transporting function and aromatic tertiary amines having the hole-transporting function.

10. An organic electroluminescence device material obtained by the process recited in claim 1.

11. An organic electroluminescence device material according to claim 10, wherein the target is an organic polymer having at least one function selected from the electron-transporting function and the hole-transporting function.

12. An organic electroluminescence device which comprises a pair of electrodes and an organic electroluminescence device material recited in claim 10 which is interposed between the electrodes.

13. An organic electroluminescence device which comprises a pair of electrodes and an organic electroluminescence device material recited in claim 10, which is interposed between the electrodes, wherein a single layer formed with an organic electroluminescence device material recited in claim 10 is interposed between the pair of electrodes.

* * * * *